United States Patent [19]

Kato

[11] Patent Number: 5,206,627
[45] Date of Patent: Apr. 27, 1993

[54] SUBSTRATE DETECTING SYSTEM WITH EDGE DETECTION, SUCH AS WAFER OR BASE MATERIAL OF SEMICONDUCTOR DEVICE OR LCD

[75] Inventor: Mitsuo Kato, Sagamihara, Japan

[73] Assignee: Tokyo Electron Sagami Limited, Kanagawa, Japan

[21] Appl. No.: 794,943

[22] Filed: Nov. 20, 1991

[30] Foreign Application Priority Data

Nov. 21, 1990 [JP] Japan ................. 2-316860

[51] Int. Cl.⁵ ............................................ G08B 21/00
[52] U.S. Cl. ........................... 340/674; 250/224; 269/903; 340/540; 340/568; 414/DIG. 2
[58] Field of Search .............. 340/674, 540, 568; 250/224; 414/DIG. 2; 269/903, 909

[56] References Cited

U.S. PATENT DOCUMENTS

| | | | |
|---|---|---|---|
| 4,859,993 | 8/1989 | Kagami et al. | 340/674 |
| 4,938,655 | 7/1990 | Asano | 414/786 |
| 4,987,407 | 1/1991 | Lee | 340/540 |
| 5,095,300 | 3/1992 | Alexander et al. | 340/686 |

*Primary Examiner*—Glen R. Swann, III
*Attorney, Agent, or Firm*—Oblon, Spivak, McClelland, Maier & Neustadt

[57] ABSTRACT

A plurality of light-emitting/receiving sections respectively include light-emitting sections arranged to correspond to substrates to be detected and light-receiving sections for receiving beams from the light-emitting sections. The substrates to be detected are a predetermined number of substrates arranged and accommodated at predetermined intervals in a substrate accommodating section. A moving section relatively moves the plurality of light-emitting/receiving sections and the substrates to be detected in directions cross or perpendicular to each other. A plurality of signal processing sections respectively detect changes in received light amounts caused in accordance with an output signal from each of light-receiving sections, when beams from the light-emitting sections are opposite to edge portions of the substrates to be detected while the plurality of light-emitting/receiving sections and the substrates to be detected are moved relative to each other in the directions cross or perpendicular to each other by the moving section. A detecting section detects the presence/absence of the predetermined number of substrates to be detected which are arranged and accommodated in the substrate accommodating section in accordance with output signals from the plurality of signal processing sections.

19 Claims, 5 Drawing Sheets

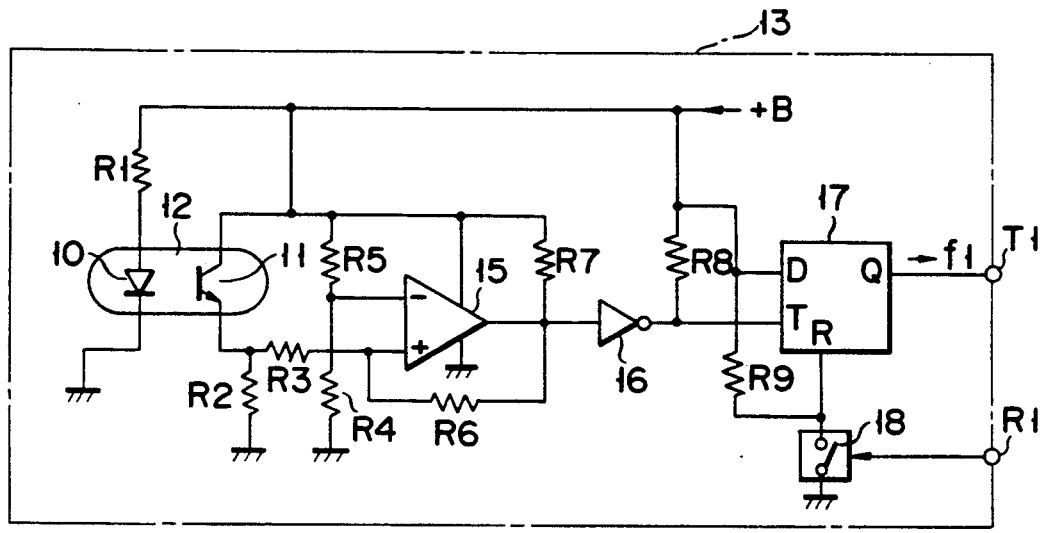
F I G. 2
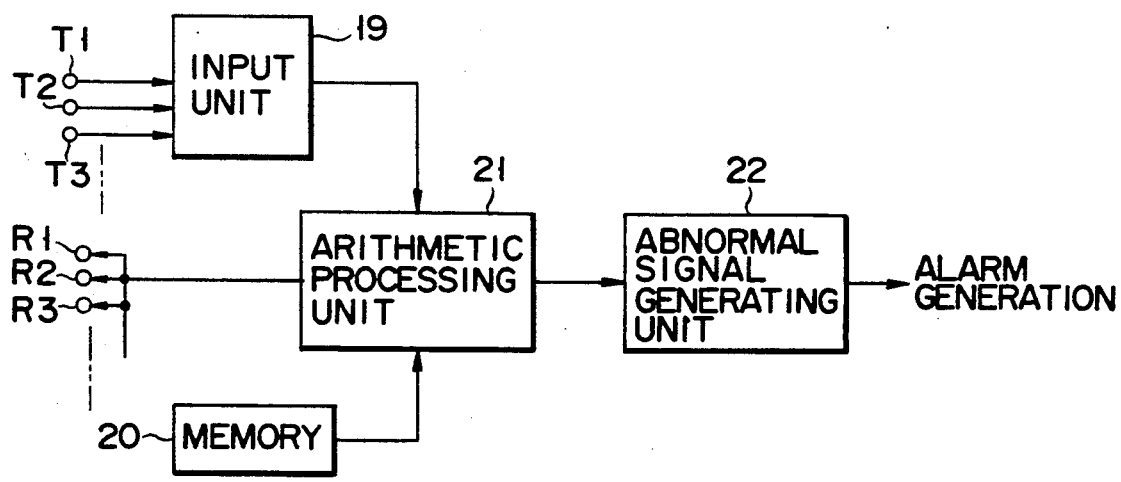
F I G. 3

SUBSTRATE DETECTING SYSTEM WITH EDGE DETECTION, SUCH AS WAFER OR BASE MATERIAL OF SEMICONDUCTOR DEVICE OR LCD

BACKGROUND OF THE INVENTION

1. Field of the Invention

The present invention generally relates to a substrate detecting system and, more particularly, to a system for performing detection processing for the presence/absence of a base material or a wafer of a semiconductor device or a liquid crystal display device (LCD) including a transparent substrate.

2. Description of the Related Art

In a general process for manufacturing a semiconductor device or a liquid crystal display device (LCD), a predetermined number of wafers or base materials are accommodated in a vessel called a cassette (carrier), and they are moved through various steps. In every step, detection processing is performed about the presence/absence of the wafers or base materials For example, a conventional detecting system for detecting the presence/absence of a large number of wafers accommodated in a carrier used in a semiconductor manufacturing process includes optical detecting units, the number of which is the number of wafers to be accommodated. That is, one of the wafer detecting apparatuses causes a light-receiving element to receive an infrared beam radiated from a light-emitting element such as a light-emitting diode (LED) so as to detect the presence/absence of a wafer (the infrared beam is interrupted due to the presence of the wafer and not received by the light-receiving element). In another conventional wafer detecting apparatus, a non-contact detecting method is employed. That is, in this method, a laser beam is radiated onto a wafer, and the beam reflected by the wafer is received, thereby detecting the presence/absence of a wafer (the reflected beam is not received without the presence of a wafer).

In recent years, a transparent substrate made of quarts glass is often used as a wafer or substrate in a certain type semiconductor device or liquid crystal display device (LCD). However, since a radiation beam or laser beam from the light-emitting element of a conventional optical detecting apparatus is transmitted through the transparent wafer or substrate, a beam to be received by a light-receiving element is not interrupted by the presence of the wafer or substrate, and the optical detecting apparatus cannot detect the presence/absence of the wafer or substrate. For this reason, the following contact detecting method or the like is employed. In this method, the wafer or substrate is brought into contact with a member having a spring, and the spring is contracted by the weight of the wafer or substrate to operate a microswitch, thereby detecting the presence/absence of the wafer or substrate.

In detection of the wafer or substrate using the contact detecting method, the wafer is easily damaged at its contact portion. In addition, in some step, a thin film formed on the wafer may be removed to easily produce dust or particles, thereby inevitably forming a contamination source. Therefore, the yield of finished semiconductor elements or liquid crystal display devices (LCD) is disadvantageously decreased.

SUMMARY OF THE INVENTION

It is, therefore, an object of the present invention to provide a new and improved substrate detecting apparatus with an edge detection thereof, wherein, for example, a wafer of a semiconductor device including, e.g., a quartz-glass transparent substrate, or a base material of an LCD can be effectively detected by a non-contact method.

It is another object of the present invention to provide a substrate detecting method capable of effectively detecting a wafer of a semiconductor device including, e.g., a quarts-glass transparent substrate, or a base material of an LCD by using a non-contact method.

According to one aspect of the present invention, there is provided a substrate detecting apparatus, comprising:

a plurality of light-emitting/receiving means having light-emitting sections arranged to correspond to substrates to be detected and light-receiving sections for receiving beams from the light-emitting sections, respectively, the substrates to be detected being a predetermined number of substrates arranged and accommodated at predetermined intervals in a substrate accommodating means;

moving means for relatively moving the plurality of light-emitting/receiving means and the substrates to be detected in directions cross or perpendicular to each other;

a plurality of signal processing means for detecting changes in amounts of received beams radiated in accordance with an output signal from each of the light-receiving sections when beams from the light-emitting sections are opposite to edge portions of the substrates to be detected, respectively, while the plurality of light-emitting/receiving means and the substrates to be detected are moved relative to each other in the directions cross or perpendicular to each other by the moving means; and detecting means for detecting the presence/absence of the predetermined number of substrates to be detected which are arranged and accommodated in the substrate accommodating means in accordance with output signals from the plurality of signal processing means.

According to another aspect of the present invention, there is provided a substrate detecting method, comprising the steps of:

providing a plurality of photointerrupter means in correspondence with a predetermined number of substrates to be detected which are arranged and accommodated in cassette means at predetermined intervals;

relatively moving the plurality of photointerrupter means and the substrates to be detected in directions cross or perpendicular to each other;

detecting changes in output signals generated by the plurality of photointerrupter means when beams from the plurality of photointerrupter means are opposite to edge portions of the substrates to be detected, respectively, while the plurality of photointerrupting means and the substrates to be detected are moved relative to each other in the directions cross or perpendicular to each other; and detecting the presence/absence of the predetermined number of substrates to be detected which are arranged and accommodated in the cassette means in accordance with the detected changes in output signals.

According to the present invention, the presence/absence of both of a transparent substrate and a non-transparent substrate can be reliably detected by a non-contact method.

Additional objects and advantages of the invention will be set forth in the description which follows, and in part will be obvious from the description, or may be learned by practice of the invention. The objects and advantages of the invention may be realized and obtained by mean of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments give below, serve to explain the principles of the invention.

FIG. 2 is a circuit diagram showing a sensor middle of the embodiment shown in FIG. 1;

FIG. 3 is a view showing an arrangement of a detecting section of the embodiment shown in FIG. 1;

DETAILED DESCRIPTION OF THE PREFERRED EMBODIMENTS

Figure 1:
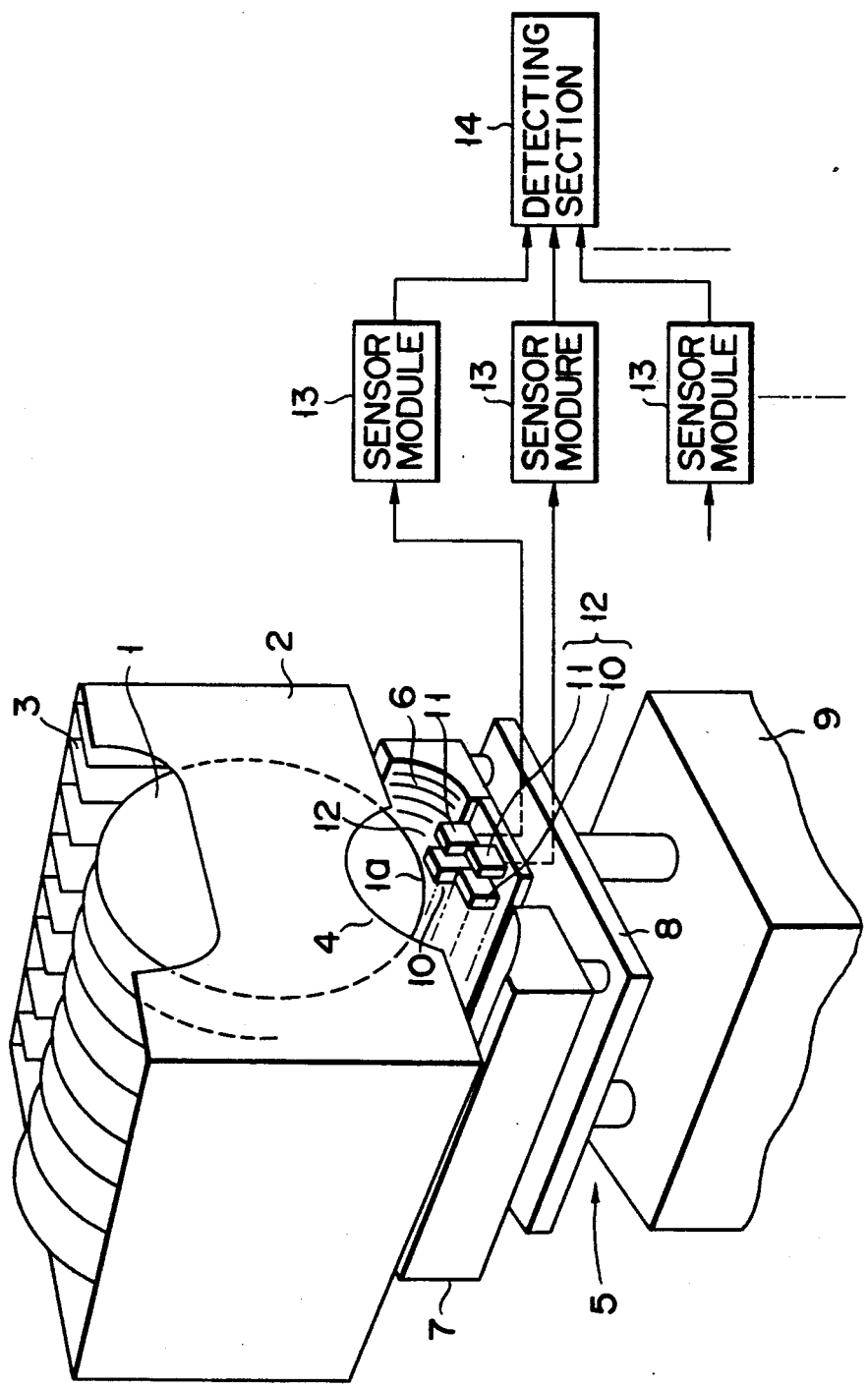
FIG. 1 is a view showing an arrangement of a substrate detecting apparatus according to an embodiment of the present invention.

Reference will now be made in detail to the presently preferred embodiments of the invention as illustrated in the accompanying drawings, in which like reference characters designate like or corresponding parts throughout the several drawings.

An embodiment obtained by applying a substrate detecting apparatus according to the present invention as a wafer detecting apparatus used in a process for manufacturing a semiconductor device will be described below with reference to the accompanying drawings.

In FIG. 1, the wafer detecting apparatus is arranged to simultaneously detect a plurality of wafers 1, e.g., 25 wafers 1, made of quartz glass and serving as transparent substrates. The wafers 1 are accommodated in a cassette (carrier) 2. 25 grooves 3 in which the large number of wafers 1 are inserted and supported are formed in the side walls of the carrier 2 at predetermined intervals, and a open portion 4 is formed on the lower portion of the carrier 2. Since the lower edge portion of the carrier 2 is mounted on a base member (not shown), in this embodiment, the carrier 2 is fixed.

A moving mechanism 5 for lifting the wafers 1 accommodated in the carrier 2 from the open portion 4 of the carrier 2 by a predetermined amount is arranged below the carrier 2. The moving mechanism 5 comprises a mounting table 8, having a guide 7, and a driver 9 for vertically moving the mounting table 8. Grooves 6 for supporting the lifted wafers 1 are formed such that the number of grooves is equal to that of the grooves 3 of the carrier 2. Therefore, all the wafers 1 accommodated in the carrier 2 can be simultaneously lifted.

Photointerrupters 12 corresponding to the wafers 1 supported in the grooves 6 by the lifted guide 7 are arranged on the mounting table 8 in a zigzag form such that the number of photointerrupters is equal to the number of the wafers 6. Each of the photointerrupters 12 serves as a light-emitting/receiving means and is constituted by a light-emitting diode 10 of a light-emitting element serving as a light-emitting section and a phototransistor 11 of a light-receiving element serving as a light-receiving section.

The above arrangement is described in the U.S. Pat. No. 4,859,993 which is assigned by the affiliated company of the assignee of the present invention. Therefore, the description of this U.S. Pat. No. 4,859,993 is incorporated in the specification.

Sensor modules 13, each of which is a signal processing means for processing a signal output from each of the photointerrupters 12, are electrically connected to the photointerrupters 12, respectively. In addition, a detecting section 14 which is a detecting means for detecting the presence/absence of the wafer 1 in response to a signal output from each of the sensor modules 13 is arranged.

Each of the sensor modules 13 corresponding to the wafers 1, as shown in FIG. 2, as a representative of the sensor modules 13, comprises the photointerrupter 12 constituted by the light-emitting diode 10 and the phototransistor 11, a comparator 15, a waveform shaping circuit 16, and a flip-flop 17.

The cathode of the light-emitting diode 10 of the photointerrupter 12 is connected to a reference potential point, and the anode of the light-emitting diode 10 is connected to a power supply +B through a resistor R1. The collector of the phototransistor 11 is connected to the power supply +B, and the emitter is connected to the reference potential point through a resistor R2. The inverting (−) terminal of the comparator 15 is connected to the connection point of series-connected resistors R5 and R4, one terminal of which is connected to the power supply +B and the other terminal of which is connected to the reference potential point, and the non-inverting (+) terminal of the comparator 15 is connected to the emitter of the phototransistor 11 through a resistor R3.

The output terminal of the comparator 15 is fed back to its non-inverting (+) terminal through a resistor R6, connected to the power supply +B through a resistor R7, and connected to the trigger (T) terminal of the flip-flop 17 through the waveform shaping circuit 16 serving as an inverter. The data (D) terminal of the flip-flop 17 connected to the power supply +B is connected to the T terminal through a resistor R8 and to the reset (R) terminal through a resistor R9. The other terminal of a reset switch 18 constituted by, e.g., a semiconductor analog switch, and having one terminal connected to the reference potential point is connected to the R terminal. The Q terminal of the flip-flop 17 is connected to a terminal $T_{1-n}$, and the reset switch 18 is connected to a terminal $R_{1-n}$.

The detecting section 14 connected to each of the terminals $T_{1-n}$ of the sensor modules 13 each having the above arrangement comprises an input unit 19, an arithmetic processing unit 21, and an abnormal signal generating unit 22, as shown in FIG. 3. The input unit 19 receives a signal corresponding to the presence/absence of the wafer 1. The arithmetic processing unit 21 collates data input to the input unit 19 with data prestored in the memory 20. The abnormal signal generating unit 22 generates an abnormal signal when an abnormal state is detected in the arithmetic processing unit 21.

An operation of the wafer detecting apparatus with the above arrangement will be described below.

Figure 4:
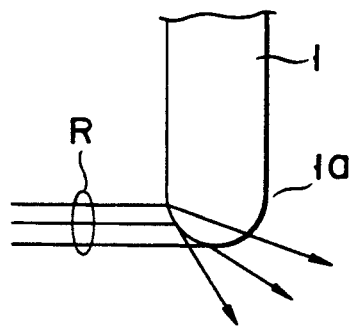
FIG. 4 is a view showing a wafer edge portion of the embodiment shown in FIG. 1.
Figure 5:
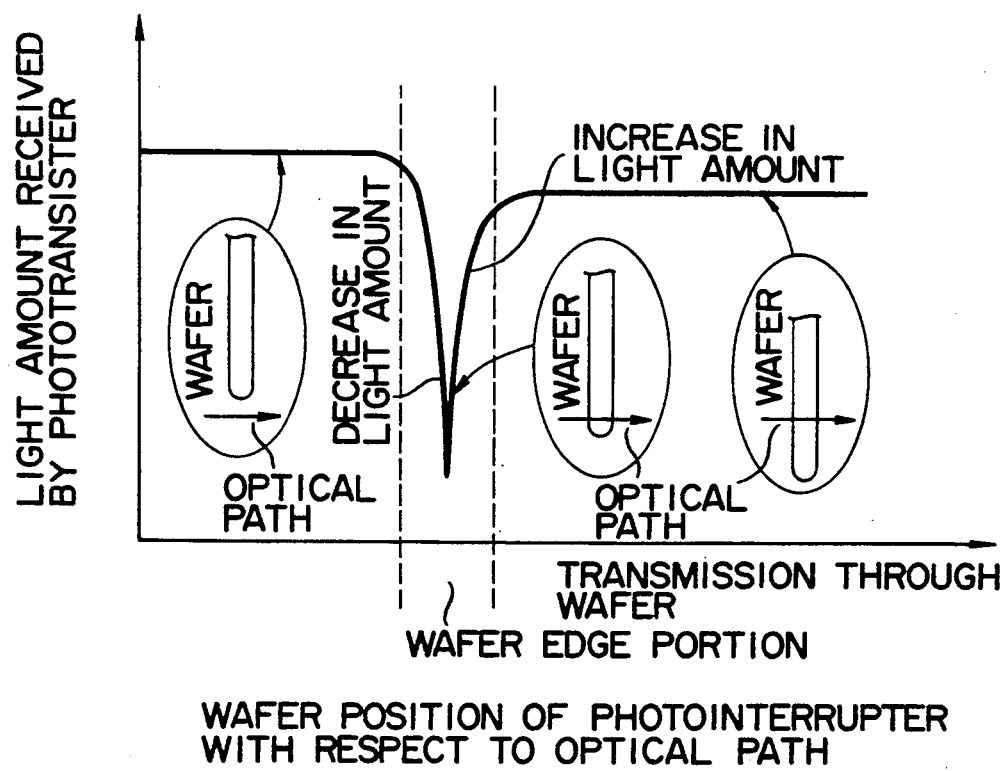
FIG. 5 is a graph showing characteristics of a change in light amount.

The driver 9 is actuated to lift the moving mechanism 5 such that each of the wafers 1 accommodated in the carrier 2 is supported in the groove 6 of the guide 7. During upward movement, the optical path of an infrared beam radiated from the light-emitting diode 10 arranged on the mounting table 8 to the phototransistor 11 passes through an edge portion 1a of the wafer 1. At this time, since the edge portion 1a of the wafer 1 generally has a curved surface as shown in FIG. 4, the infrared beam R is diffused by the edge portion 1a of the wafer 1, and an amount of light reaching the photo resistor 11 is abruptly decreased as shown in the graph of FIG. 5. When the light amount is decreased, the collector current of the phototransistor 11 is decreased to decrease its emitter voltage, thereby operating the comparator 15. When the comparator 15 is operated, since the flip-flop 17 is operated, a latch signal $f_1$ is sent to the terminal $T_{1-n}$ connected to the Q terminal of the flip-flop 17. The latch signal $f_1$ is input to the input unit 19 of the detecting section 14 and then compared with wafer data from the memory 20 in the arithmetic processing unit 21. When the wafer data input to the memory 20 in advance is compared with detection data from the detecting section 14 the comparison result is checked as a scheduled one. At this time, the arithmetic processing unit 21 sends a reset signal to each of the reset switches 18 through the terminal $R_{1-n}$ of each of the sensor modules 13. The reset switch 18 resets the flip-flop 17 in a ready state for detecting the presence/absence of the wafer 1. When the detection in the arithmetic processing unit 21 is different from the scheduled one, a signal is sent from the arithmetic processing unit 21 to the abnormal signal generating unit 22 to generate an alarm tone or the like from the abnormal signal generating unit 22.

The above detection of the wafer 1 is simultaneously performed to the all wafers accommodated in the carrier 2, and the presence/absence of the wafer in the carrier 2 is detected so as to perform predetermined processing. A case wherein the presence/absence of the wafer 1 is detected by a decrease in light amount has been described above. However, since the change in light amount has characteristics shown in FIG. 5, i.e., the light amount is abruptly increased when the position of the optical path is shifted from the edge portion 1a of the wafer 1 to the inside of the wafer 1, the presence/absence of the wafer 1 may be detected by this abrupt increase in light amount.

Figure 6:
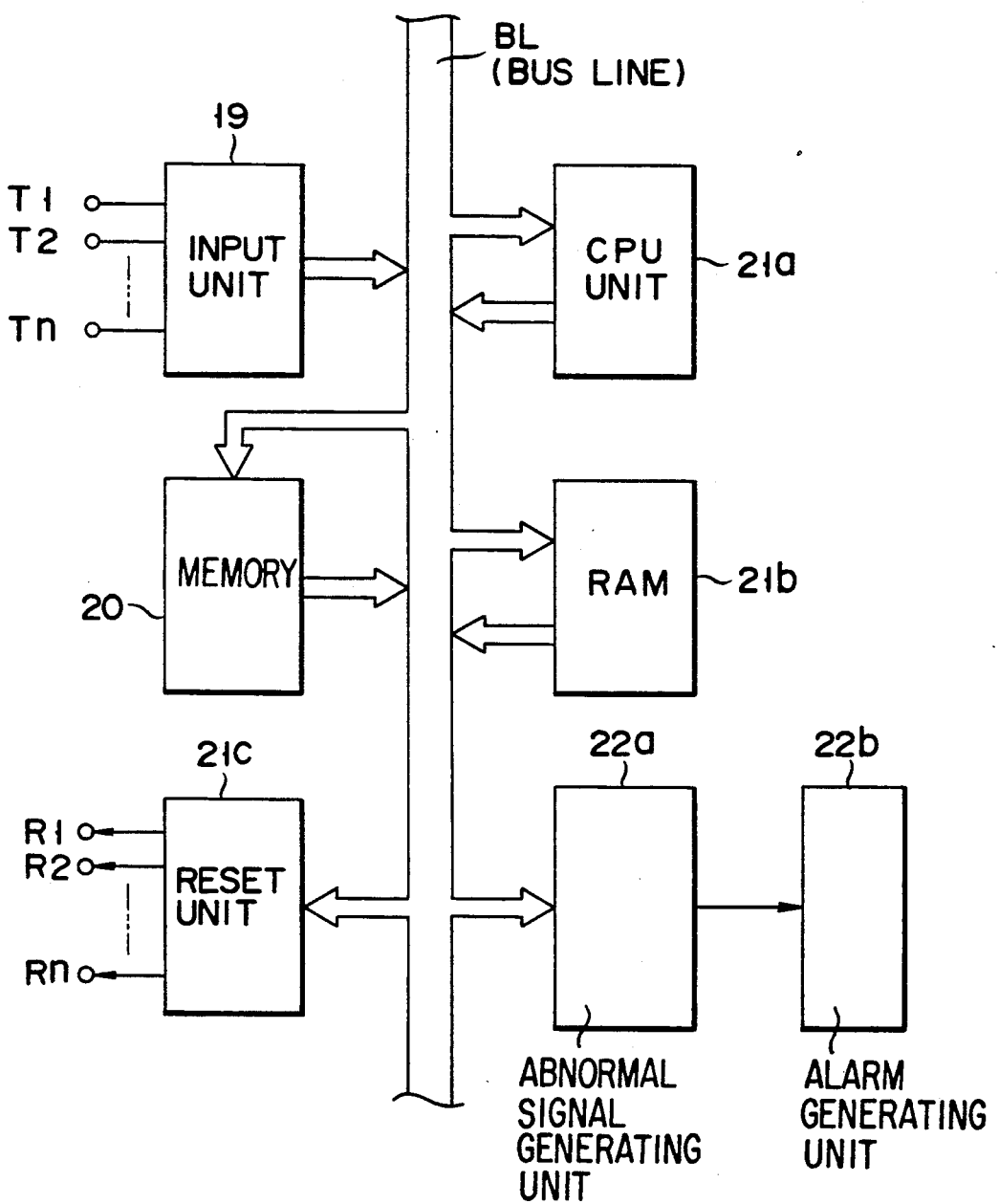
FIG. 6 is a view showing a detailed arrangement of FIG. 3.
Figure 7:
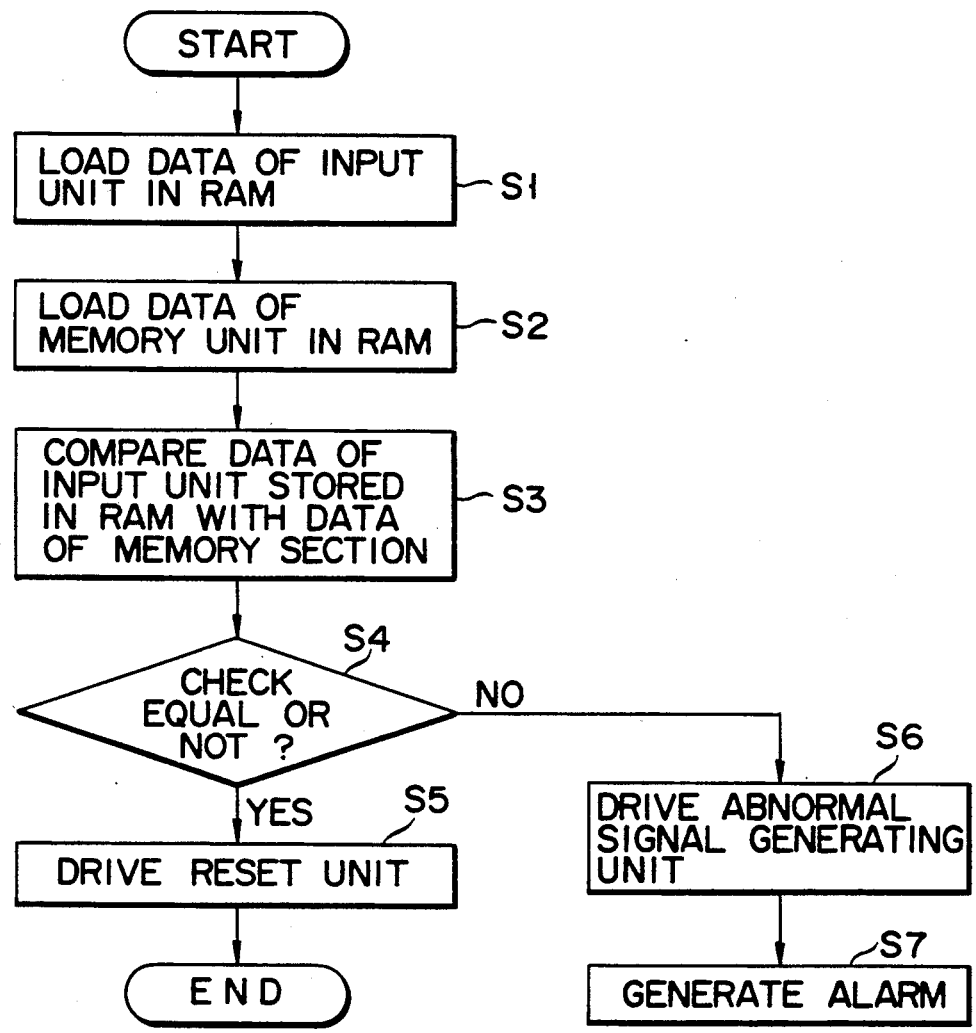
FIG. 7 is a flow chart for explaining an operation of FIG. 6.

FIG. 6 is a view showing a detailed arrangement of the detecting section 14 in FIG. 3, and FIG. 7 is a flow chart of the arrangement.

That is, in this case, the detecting section 14 is connected to a host computer (not shown) for controlling all steps of manufacturing a semiconductor device through a bus line BL. In the memory 20, wafer data (e.g., all the 25 wafers are accommodated in the carrier, or the wafer of the nth groove is absent) of each carrier to be detected by the corresponding wafer detecting apparatus is stored from the host computer in advance.

Data of the input section 19 is loaded in a random access memory (RAM) 21b in step S1, and data of the memory 20 is loaded in the RAM 21b in step S2. In steps S3 and S4, a central processing unit (CPU) 21a compares the data stored in the RAM 21b from the input unit 19 with the data from the memory 20 and checks whether the data from the input unit 19 is equal to the data from the memory 20, i.e., whether this detection is a scheduled one. If YES in step S4, the CPU 21a supplies a reset signal to the terminal $R_{1-n}$ of each of the above sensor modules 13 through a reset unit 21c, and the CPU 21a is set in a ready state for the next wafer detection. If NO in step S4, the CPU 21a drives an abnormal signal generating unit 22a to generate an alarm from an alarm generating unit 22b (steps S6 and S7).

In the above embodiment, the photointerrupter 12 is moved upward with respect to the wafer 1. However, the following arrangement may be employed. That is, the photointerrupter 12 is fixed, and the wafer 1, i.e., the carrier 2 as a whole, is moved downward, such that the photointerrupter 12 and the carrier 2 is relatively moved in directions cross or perpendicular to each other.

In this arrangement for moving the carrier downward, the technique assigned by the same assignee as that of the present invention and disclosed in the U.S. Pat. No. 4,938,655 can be utilized.

The above wafer detecting apparatus is applied to all process steps of manufacturing a semiconductor device including an annealing process step, an etching process step, and the like.

The above description exemplifies one embodiment of the present invention. A light-emitting element is not limited to a photointerrupter, and a signal processing section and a detecting section are not limited those in this embodiment.

The present invention can be preferably applied to not only detection of a quartz glass wafer but detection of a transparent substrate such as a liquid crystal substrate through which a beam from a light-emitting means is transmitted. As a matter of cause, the present invention can be applied to a non-transparent substrate.

As is apparent from the above description, in the substrate detecting apparatus according to the present invention, the presence/absence of a substrate can be effectively detected without contact, even though the substrate is a substrate through which a beam from a light-emitting means is transmitted. Therefore, production of dust caused by contact can be prevented, and the presence/absence of the substrate can be detected in a clean state. For this reason, the present invention contributes to an increase in yield of semiconductor devices or liquid crystal devices to be manufactured.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A substrate detecting apparatus, comprising:
 a plurality of light-emitting/receiving means having light-emitting sections arranged to correspond to substrates to be detected and light-receiving sections for receiving beams from the light-emitting sections, said substrates to be detected being a predetermined number of substrates arranged and accommodated at predetermined intervals in a substrate accommodating means;

moving means for relatively moving said plurality of light-emitting/receiving means and said substrates to be detected in directions cross or perpendicular to each other;

a plurality of signal processing means for detecting changes in amounts of received light in accordance with an output signal from each of said light-receiving sections when beams from said light-emitting sections are opposite to edge portions of said substrates to be detected, respectively, while said plurality of light-emitting/receiving means and said substrates to be detected are moved relative to each other in the directions cross or perpendicular to each other by said moving means; and detecting means for detecting the presence/absence of said predetermined number of substrates to be detected which are arranged and accommodated in said substrate accommodating means in accordance with output signals from said plurality of signal processing means.

2. An apparatus according to claim 1, wherein each of said plurality of signal processing means includes comparator means for comparing an output signal from each of said light-receiving sections with a predetermined reference value.

3. An apparatus according to claim 2, wherein each said plurality of signal processing means includes latch means for latching an output signal from said comparing means.

4. An apparatus according to claim 3, wherein said detecting means includes memory means for prestoring data relating to said substrates to be detected accommodated in said substrate accommodating means.

5. An apparatus according to claim 4, wherein said detecting means includes checking means for checking whether scheduled detection is performed in accordance with output signals from said plurality of signal processing means and the data stored in said memory means.

6. An apparatus according to claim 5, wherein said detecting means includes means for supplying a reset signal to said latch means when said checking means checks that the scheduled detection is performed.

7. An apparatus according to claim 5, wherein said detecting means includes abnormal signal generating means for generating an abnormal signal when said checking means checks that the scheduled detection is not performed.

8. An apparatus according to claim 7, wherein said detecting means includes alarm generating means for generating an alarm in response to the abnormal signal generating by said abnormal signal generating means.

9. An apparatus according to claim 8, wherein said alarm generating means includes means for generating an alarm tone.

10. An apparatus according to claim 1, wherein said plurality of signal processing means include means for detecting the change in received light amount when the light amount is decreased.

11. An apparatus according to claim 1, wherein said plurality of signal processing means include means for detecting the change in received light amount when the received light amount is increased after the received light amount is decreased as the change in received light amount.

12. An apparatus according to claim 1, wherein, when said substrate to be detected is a transparent substrate, said plurality of signal processing means detect an abrupt decrease in light amount caused by light diffusion occurring when a beam from said light-emitting section is incident on an edge portion of said transparent substrate.

13. An apparatus according to claim 12, wherein said transparent substrate is made of quartz glass.

14. An apparatus according to claim 13, wherein said substrate made of quartz glass includes a wafer used in a process for manufacturing a semiconductor device.

15. An apparatus according to claim 13, wherein said transparent substrate made of quartz glass includes a substrate used in a process for manufacturing a liquid crystal device.

16. A substrate detecting method, comprising the steps of:

providing a plurality of photointerrupter means in correspondence with a predetermined number of substrates to be detected which are arranged and accommodated in cassette means at predetermined intervals;

relatively moving said plurality of photointerrupter means and said substrates to be detected in directions cross or perpendicular to each other;

detecting changes in output signals generated by said plurality of photointerrupter means when beams from said plurality of photointerrupter means are opposite to edge portions of said substrates to be detected, respectively, while said plurality of photointerrupting means and said substrates to be detected are moved relative to each other in the directions cross or perpendicular to each other; and detecting the presence/absence of said predetermined number of substrates to be detected which are arranged and accommodated in said cassette means in accordance with the detected changes in output signals.

17. A method according to claim 16, wherein said substrates to be detected include a transparent substrate made of quartz glass.

18. A method according to claim 17, wherein said transparent substrate made of quartz glass includes a wafer used in a process for manufacturing a semiconductor device.

19. A method according to claim 17, wherein said transparent substrate made of quartz glass includes a substrate used in a process for manufacturing a liquid crystal device.

* * * * *